[19] United States Patent
Bernasconi et al.

[11] 4,122,388
[45] Oct. 24, 1978

[54] APPARATUS FOR TESTING THE SHAFT/BEARING INSULATION OF A TURBO-MACHINE

[75] Inventors: Felix R. Bernasconi, Zollikerberg; Max Salm, Wettingen, both of Switzerland

[73] Assignee: BBC Brown, Boveri & Company Limited, Baden, Switzerland

[21] Appl. No.: 787,214

[22] Filed: Apr. 13, 1977

[30] Foreign Application Priority Data

Apr. 22, 1976 [CH] Switzerland ............... 5029/76

[51] Int. Cl.² ..................................... G01R 31/12
[52] U.S. Cl. .......................................... 324/54
[58] Field of Search ................ 324/51, 54, 158 MG; 340/269

[56] References Cited
U.S. PATENT DOCUMENTS

| 2,310,335 | 2/1943 | Wolfson | 324/54 X |
| 2,650,346 | 8/1953 | Rasor | 324/54 |
| 3,303,410 | 2/1967 | Hoover et al. | 324/54 |
| 3,746,979 | 7/1973 | Kildishev et al. | 324/51 |
| 3,831,160 | 8/1974 | Cronin et al. | 324/51 X |
| 3,904,940 | 9/1975 | Burrus | 324/54 X |

Primary Examiner—Gerard R. Strecker
Attorney, Agent, or Firm—Burns, Doane, Swecker & Mathis

[57] ABSTRACT

Apparatus provided for testing the shaft/bearing insulation characteristic of a rotary machine, e.g., a turbo-machine, wherein the shaft is normally earthed by means of an earthing brush on the shaft and connected to ground. A first circuit arrangement is provided for breaking the shaft-earthing connection, a second circuit arrangement is provided for applying an increasing test voltage between the shaft bearing which is grounded and the earthing brush while the shaft-earthing connection remains broken, this being in the form of a progressively charged capacitor connected between the shaft bearing and earthing brush, and a third circuit arrangement is provided for measuring the change in voltage across the capacitor resulting from a breakdown in the insulation between the shaft and its bearing during the testing operation. The testing operation is performed periodically and a test cycle is terminated as soon as the test voltage reaches a predetermined maximum value, or there is a breakdown in the insulation between the shaft and its bearing whichever occurs first.

10 Claims, 2 Drawing Figures

APPARATUS FOR TESTING THE SHAFT/BEARING INSULATION OF A TURBO-MACHINE

BACKGROUND OF THE INVENTION

This invention relates to an improvement in apparatus for the testing of shaft/bearing insulation of machines by means of an electric voltage applied between shaft and ground, and means to indicate failures.

In the case of turbomachines electrical voltages, the so-called shaft voltages, will be generated between the rotor shaft and its bearings in the course of operations. These voltages have various sources, for example frictional electricity caused by the steam or gas flow
the "Lenard-Effect" caused by wet steam
shearing action by the oil film in the journal bearing
induced d.c. and a.c. voltages
insulating defects of the machine.

Due to the different charges of shaft and bearings, spark-overs will occur frequently and thus cause a flow of current between shaft and bearing. These current flows can lead to damages, primarily at the journal bearing, the shaft journal and the pinions driving the lubricating oil pump. If these damages are not detected in the initial stage, the machine parts so damaged will require extensive repairs or replacements or can cause other serious damages. The consequences are stoppage of production and high repair costs.

Various steps have been taken to eliminate these shaft currents, for example by discharging the current by way of an earthing brush and by insulating the bearings against the ground or earth potential. However, these devices are insufficient in practice because a proper contact of the earthing brush cannot be guaranteed and maintained due to poor servicing, current-induced fouling or an out-of-round running shaft. It is also necessary to check at regular intervals any insulation between bearing bushing and ground, a step often neglected because of poor accessibility, especially in the case of DT-groups using water heated by nuclear power.

For this reason steps have been taken to monitor the insulation with the aid of an electric circuit which will indicate immediately any defects in the insulation. Here, the shaft is grounded, and the shaft/bearing capacitance and the bearing/ground capacitance are connected in series. A measuring device, inserted between bearing and shaft, will indicate any changes in voltage occurring at this point, for example by the flashing of an incandescent lamp. An arrangement of this type is described for example by U.S. Pat. No. 3,904,940.

However, arrangements of this type have the disadvantage that they can operate only at low test voltages when working continuously so that slightly growing defects in insulation cannot be detected. Furthermore, the test voltage is not constant but is a function of the shaft voltage which will fluctuate widely on account of the various sources of this voltage. Furthermore, it is necessary to use another brush in addition to the earthing brush, and to provide a bearing/ground insulation for all radial and axial bearings of the machine aggregate, and possibly even for some auxiliary drives.

SUMMARY OF THE INVENTION

The principal object of the invention is to provide an apparatus for the testing of shaft/bearing insulation of the above described type which will indicate even slight defects in insulation at all times, and without the necessity to insulate all bearings against ground.

This problem is solved for an arrangement of the above specified type in that manner that there are provided a first circuit arrangement to disconnect the earthing of the shaft, a second circuit arrangement to apply, during the period of disconnection, a test voltage across the shaft by way of at least one earthing brush and a bearing, and a third circuit arrangement to determine the voltage that arises across the point of disconnection.

It will be expedient to connect a capacitor between the bearing and the earthing brush to serve as voltage source for the test voltage, and to lead high-frequency alternating voltages to the ground. It will also be advantageous to provide a circuit arrangement which makes it possible to vary the test voltage. A pulse generator or a sawtooth generator, serving to charge the capacitor, is particularly suited for varying the test voltage. It is also advantageous to limit the test voltage, for example by means of a limit switch and a circuit breaker controlled by this switch. It will be expedient to provide circuit arrangements which make possible an automatic, and preferably periodic start of the testing operation as well as an automatic break-off or conclusion respectively of the testing operation in case of malfunctions and/or when the maximum test voltage has been reached.

BRIEF DESCRIPTION OF THE DRAWINGS

Additional details of the invention are disclosed by the practical example which is explained below on the basis of the accompanying drawings wherein.

DETAILED DESCRIPTION OF PREFERRED EMBODIMENTS

Figure 1:
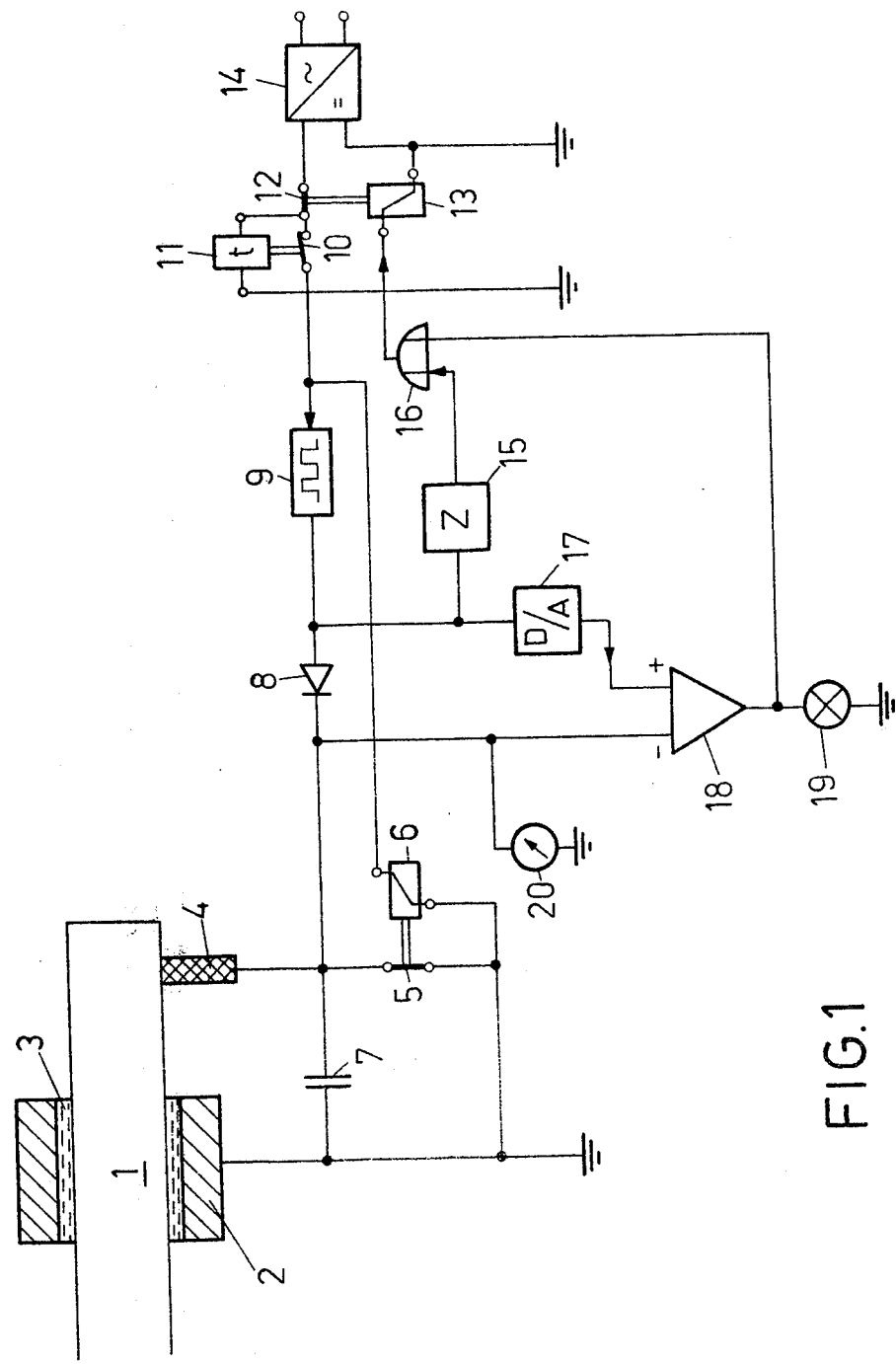
FIGS. 1 and 2 of the drawing each show one apparatus for the automatic, periodic testing of the shaft/bearing insulation.

In FIG. 1 there is mounted one shaft (rotor) 1 within a journal bearing 2, with a lubricant oil 3 placed between the shaft 1 and the journal bearing 2. The shaft 1 is equipped with an earthing brush 4 which is connected to ground by way of an openable contact 5 of a relay 6. A capacitor 7 is connected in parallel to the capacitance formed by the shaft 1, the bearing 2 and the lubricant oil 3, located between these two components. The earthing brush 4 is connected to one plate of capacitor 7 and to the cathode of a diode 8. The output side of a pulse generator 9 is connected to the anode of the diode 8, and the signal input to generator 9 is connected to a d.c. voltage source 14 by way of the closable contact 10 of a time relay 11 and the openable contact 12 of a relay 13. The coil of the relay 6 is placed between the wire connecting the closable contact 10 with the pulse generator 9 and ground, and the coil of the time relay 11 is placed between the wire connecting the closable contact 10 with the openable contact 12 and ground. The input of a preselection counter 15 with limit switch is connected with the anode of the diode 8 and its output with one input of an OR-gate switching element 16. The input to a digital-analog converter 17 is also connected to the anode of diode 8 and its output to one input terminal (+) of a voltage comparator 18. The other input terminal (−) of the voltage comparator 18 leads to the earthing brush 4. The output terminal from comparator 18 is connected to a signal lamp 19 and to a second input of the OR-gate 16. The output of the OR-gate 16 leads to the coil of the relay 13 controlling contact 12. A voltmeter 20 with a limit indicator is included in the circuit between the earthing brush 4 and ground.

In order to test the shaft/bearing insulation the time relay 11 will close the contact 10 when the set time has elapsed and thereby actuate the relay 6, whereupon contact 5 will open and interrupt the ground connection. At the same time the pulse generator 9 is started, delivering a series of pulses to the capacitor 7, its d.c. voltage thereby increasing step-by-step. The counter 15 will count the number of pulses. The digital analog converter 17 furnishes a comparison voltage for the voltage comparator 18. When the preselected number of pulses corresponding to the maximum test voltage —for example 100 V- is reached, the counter 15 transmits a signal to the OR-gate 16 which will switch the relay 13, concluding the testing process by the opening of its contact 12. If a puncture —for example through the lubricant oil 3— occurs before the maximum testing voltage has been reached, the capacitor 7 will discharge and the voltage will drop. On the basis of the difference between the (+) reference voltage, supplied by the digital analog converter 17, and the (−) actual voltage at capacitor 7, the voltage comparator will actuate the signal lamp 19 and, by way of the OR-gate 16, the relay 13, thereby terminating the testing process. The voltmeter 20 with limit indicator shows the magnitude of the testing voltage, i.e. the voltage at which the puncture of the lubricating oil occurred.

In FIG. 2 there is again mounted a shaft 1 within a journal bearing 2, with a lubricant oil 3 placed between the shaft 1 and the journal bearing 2. The shaft 1 is equipped with an earthing brush 4 which is connected to the ground by way of an openable contact 5 of a relay 6. A capacitor 7 is connected in parallel with the capacitance formed by the shaft 1, the bearing 2 and the lubricant oil 3. The earthing brush 4 is connected to the cathode of a first diode 8, its anode leading to the output terminal of a sawtooth generator 21. The anode of a second diode 22 is connected to the anode of the first diode 8, and the cathode is connected to ground by way of a second openable contact 23 of the relay 6. Between the cathode of the second diode 22 and ground there is connected a capacitor 24, and in shunt thereto a voltmeter 20 with series resistor 25. The capacitance of the capacitor 24 equals the sum of the capacitance of the capacitor 7 and the capacitance formed by the shaft 1, the bearing 2 and the lubricant oil 3. The voltmeter 20 is equipped with a limit switch 26 which is actuated when a specific, preset voltage value is reached. The signal input of the sawtooth generator 21 is connected with a d.c. voltage source 14 by way of a closable contact 10 of a time relay 11 and an openable contact 12 of a relay 13. The coil of relay 6 is placed between the wire connecting the closable contact 10 with the sawtooth generator 21 and the ground, and the coil of the time relay 11 is placed between the wire connecting the closable contact 10 with the openable contact 12 and the ground. One input terminal of a voltage comparator 18 is connected to the earthing brush 4 and the other other input terminal to the cathode of the second diode 22. An indicating or signaling lamp 19 is placed between the output terminal of the voltage comparator 18 and the ground. One input terminal of a OR-gate 16 is connected to the output terminal of the voltage comparator 18, and the other input terminal is connected by way of the limit switch 26 with the signal input of the sawtooth generator 21. The coil of the relay 13 is placed between the output terminal of the OR-gate 16 and the ground.

Figure 2:
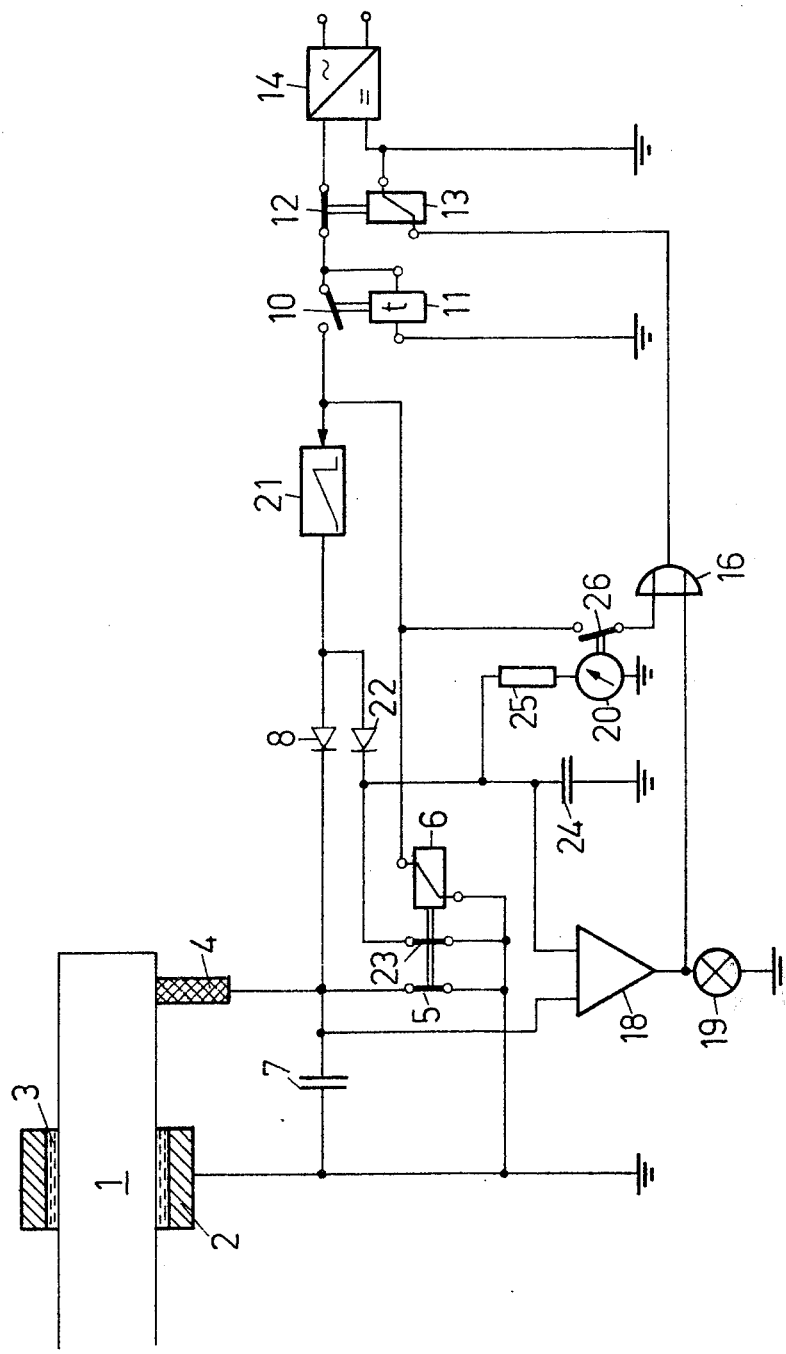

In order to test the shaft/bearing insulation by use of the testing apparatus shown by FIG. 2, the time relay 11 will close the contact 10 when the set time has elapsed and thereby actuate the relay 6, i.e. contacts 5 and 23 will open. At the same time, the sawtooth generator 21 is started, charging the capacitors 7 and 24 with gradually increasing voltage potentials. The voltages that arise across the capacitors 7 and 24 are compared by the voltage comparator 18. The voltage of capacitor 24 is measured by voltmeter 20, and the limit switch 26 will close when the maximum test voltage has been reached. This will actuate the relay 13 by way of the OR-gate 16 and the testing process is thus concluded. If a puncture through the lubricant oil 3 occurs before the maximum testing voltage has been reached, the capacitor 7 discharges, causing the voltage to drop. On the basis of the difference between the voltages of the capacitor 7 and the capacitor 24, the voltage comparator 24 then actuates the signaling lamp 19 and, by way of the OR- gate 16 the relay 13 which will terminate the testing process.

The apparatus proposed by the invention is advantageously, firstly because only a few bearings of a machine aggregate need to be insulated, resulting in a substantial savings of costs, and secondly because it makes possible a very early detection of insulating defects which may be starting, thus avoiding damages due to recurring current punctures. The apparatus makes it also possible to detect any reductions in insulation which might endanger the operation of blades, labyrinth shaft seals and bearings.

We claim:

1. Apparatus for testing the shaft/bearing insulation characteristic of a rotary machine and wherein the shaft is normally earthed by means of an earthing brush on the shaft and connected to ground, comprising a first circuit arrangement for breaking said shaft-earthing connection, a second circuit arrangement for applying an increasing test voltage between te shaft bearing which is grounded and said earthing brush while said shaft-earthing connection remains broken, and a third circuit arrangement for measuring the voltage difference existing between the earthing brush and ground to detect a breakdown in the insulation between the shaft and its bearing.

2. Apparatus as defined in claim 1 and which further includes an additional circuit arrangement by which the said testing of said shaft/bearing insulation is effected periodically.

3. Apparatus as defined in claim 1 and which further includes an additional circuit arrangement for terminating the testing operation as soon as a breakdown occurs in the insulation between the shaft and its bearing or when said test voltage reaches a predetermined maximum value whichever occurs first.

4. Apparatus as defined in claim 3 wherein said additional circuit arrangement for terminating the testing operation includes a voltage comparator by means of which the test is compared with a reference voltage, a limit switch and a circuit breaker controlled by said limit switch.

5. Apparatus for testing the shaft/bearing insulation characteristic of a rotary machine and wherein the shaft is normally earthed by means of an earthing brush on the shaft and connected to ground, comprising a first circuit arrangement for breaking said shaft-earthing connection, a capacitor connected between the shaft bearing which is grounded and said earthing brush, a second circuit arrangement for applying a charging voltage to said capacitor while said shaft-earthing connection remains broken, and a third circuit arrangement for measuring the change in voltage across said capacitor resulting from a breakdown in the insulation between the shaft and its bearing.

6. Apparatus as defined in claim 5 wherein said second circuit arrangement functions to apply a progressively increasing charging voltage to said capacitor.

7. Apparatus as defined in claim 6 wherein said progressively increasing charging voltage to said capacitor is provided by a voltage pulse generator.

8. Apparatus as defined in claim 6 wherein said progressively increasing charging voltage to said capacitor is provided by a sawtooth voltage generator.

9. Apparatus as defined in claim 5 and which further includes an additional circuit arrangement for limiting said capacitor charging voltage.

10. Apparatus as defined in claim 9 and wherein said circuit arrangement for limiting said capacitor charging voltage includes a limit switch and a circuit breaker.